United States Patent
Tada et al.

(10) Patent No.: US 7,402,877 B2
(45) Date of Patent: Jul. 22, 2008

(54) MICROMACHINE AND METHOD OF MANUFACTURING THE MICROMACHINE

(75) Inventors: Masahiro Tada, Kanagawa (JP);
Takashi Kinoshita, Kanagawa (JP);
Takeshi Taniguchi, Kanagawa (JP);
Koichi Ikeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/522,080

(22) PCT Filed: Jul. 14, 2003

(86) PCT No.: PCT/JP03/08905

§ 371 (c)(1),
(2), (4) Date: Jan. 21, 2005

(87) PCT Pub. No.: WO2004/011366

PCT Pub. Date: Feb. 5, 2004

(65) Prior Publication Data

US 2005/0245011 A1 Nov. 3, 2005

(30) Foreign Application Priority Data

Jul. 30, 2002 (JP) .............................. 2002-221433

(51) Int. Cl.
*H01L 29/82* (2006.01)

(52) U.S. Cl. ...................................... 257/414; 257/415

(58) Field of Classification Search ................. 257/25, 257/E29.34, E29.192, E21.399, E21.518, 257/414, 415

See application file for complete search history.

(56) References Cited

U.S. PATENT DOCUMENTS 5,537,083 A * 7/1996 Lin et al. ..................... 333/186

(Continued)

FOREIGN PATENT DOCUMENTS

JP          05-343943          12/1993

(Continued)

OTHER PUBLICATIONS

Frank D. Bannon, III, e al., "*High frequency microelectromechanical IF filters*", Electron Devices Meeting, 1996, Intl., San Francisco, CA Dec. 8-11, 1996, NY Dec. 8, 1996, pp. 773-776, XP010207655, ISBN: 0-7803-3393-4.

(Continued)

*Primary Examiner*—Thao P. Le
(74) *Attorney, Agent, or Firm*—Sonnenschein Nath & Rosenthal LLP

(57) ABSTRACT

To obtain a micromachine for use as a high frequency filter having a high Q value and a higher frequency band.

In a micromachine (20) including: an input electrode (7*b*), an output electrode (7*a*), and a support electrode (7*c*) disposed on a substrate (4); and a band-shaped vibrator electrode (15) formed by laying a beam (vibrating part) (16) over the output electrode (7*a*) with a space part (A) interposed between the output electrode (7*a*) and the vibrator electrode (15) in a state in which both end parts of the vibrator electrode (15) are supported on the input electrode (7*b*) and the substrate (4) with the support electrode (7*c*) interposed between the substrate (4) and the vibrator electrode (15), the entire surface of both end parts of the vibrator electrode (15) from an edge of the end parts to the beam (16) is completely fixed to the input electrode (7*b*) and the support electrode (7*c*).

4 Claims, 10 Drawing Sheets

U.S. PATENT DOCUMENTS

| | | | | |
|---|---|---|---|---|
| 2001/0031025 | A1* | 10/2001 | Nguyen | 375/349 |
| 2002/0021054 | A1* | 2/2002 | Nguyen | 310/309 |
| 2002/0074897 | A1* | 6/2002 | Ma et al. | 310/311 |
| 2003/0030965 | A1* | 2/2003 | Chua et al. | 361/306.3 |
| 2003/0201784 | A1* | 10/2003 | Potter | 324/663 |
| 2004/0095210 | A1* | 5/2004 | Nguyen | 333/187 |

FOREIGN PATENT DOCUMENTS

| | | |
|---|---|---|
| JP | 07-333077 | 12/1995 |
| JP | 08-219795 | 8/1996 |
| JP | 10-49951 | 6/1998 |
| JP | 2001-347500 | 12/2001 |
| WO | WO 01/82467 | 11/2001 |

OTHER PUBLICATIONS

Kun Wang, et al., "*Q-enhancement of microelectromechanical filters via low-velocity spring coupling*", Ultrasonics Symposium, 1997, Proceedings 1997, IEEE Toronto, Ont. Canada, Oct. 5-8, 1997, NY, IEEE, Oct. 5, 1997, pp. 323-327, XP010271308.

A. N. Cleland and M. L. Roukes; Fabrication of high frequency nanometer scale mechanical resonators from bulk Si crystals; Appl. Phys. Lett. 69 (18); Oct. 28, 1996.

Communication from EPO dated Jul. 2, 2007.

Japanese Office Action issued on Apr. 17, 2007.

\* cited by examiner

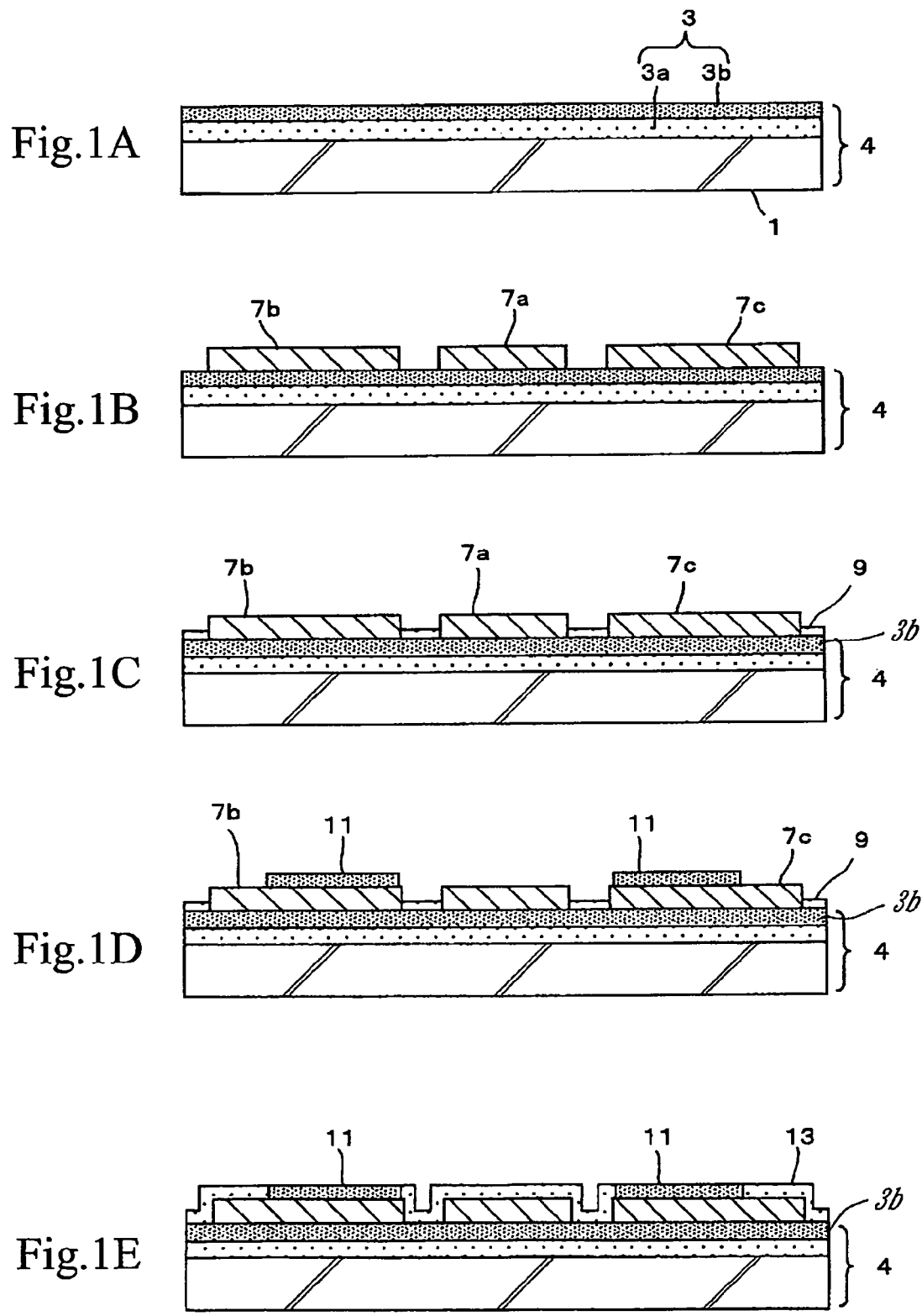

MICROMACHINE AND METHOD OF MANUFACTURING THE MICROMACHINE

RELATED APPLICATION DATA

This application claims priority to PCT/JP03/08905, filed Jul. 14, 2003, and Japanese Application No. P2002-22 1433, filed Jul. 30, 2002.

The present invention relates to a micromachine and a method of manufacturing the same, and particularly to a micromachine in which a vibrator electrode is disposed so as to cross over an output electrode with a space part interposed between the output electrode and the vibrator electrode, and a method of manufacturing the same.

With progress of technology for microfabrication on a substrate, micromachine technology is drawing attention which forms a microstructure, and an electrode, a semiconductor circuit and the like for controlling driving of the microstructure on a substrate such as a silicon substrate, a glass substrate or the like.

One of micromachines is a micro-vibrator proposed for use as a high frequency filter in radio communication. As shown in FIG. 11, a micro-vibrator 100 is formed by disposing a vibrator electrode 103 over an output electrode 102a disposed on a substrate 101 with a space part A interposed between the output electrode 102a and the vibrator electrode 103. The vibrator electrode 103 has one end part connected to an input electrode 102b formed by the same conductive layer as the output electrode 102a. When a voltage of a specific frequency is applied to the input electrode 102b, a beam (vibrating part) 103a of the vibrator electrode 103 disposed over the output electrode 102a with the space part A interposed between the output electrode 102a and the vibrator electrode 103 vibrates, thus a capacitance of a capacitor formed by the space part A between the output electrode 102a and the beam (vibrating part) 103a is changed, and this is output from the output electrode 102a. A high frequency filter including the thus formed micro-vibrator 100 can achieve a higher Q value than high frequency filters using surface acoustic waves (SAW) and thin film elastic waves (FBAR).

Such a micro-vibrator is manufactured as follows. First, as shown in FIG. 12A, an output electrode 102a, an input electrode 102b, and a support electrode 102c made of polysilicon are formed on a substrate 101 whose surface is covered with an insulating layer. These electrodes 102a to 102c are formed such that the input electrode 102b and the support electrode 102c are disposed on both sides of the output electrode 102a. Next, a sacrificial layer 105 made of silicon oxide is formed over the substrate 101 in a state of covering the electrodes 102a to 102c.

Next, as shown in FIG. 12B, connecting holes 105b and 105c reaching the input electrode 102b and the support electrode 102c are formed in the sacrificial layer 105. Thereafter a polysilicon layer 106 is formed on the sacrificial layer 105 including the inside of the connecting holes 105b and 105c.

Next, as shown in FIG. 12C, a band-shaped vibrator electrode 103 crossing over the output electrode 102a is formed by pattern etching of the polysilicon layer 106. At this time, in order to prevent etching of the input electrode 102b and the support electrode 102c made of polysilicon, the pattern etching of the polysilicon layer 106 is performed such that the connecting holes 105b and 105c are covered completely.

Thereafter the sacrificial layer 105 is selectively removed to thereby form a space part A between the output electrode 102a and the vibrator electrode 103 as shown in FIG. 11. Thus the micro-vibrator 100 is completed.

However, in the thus obtained micro-vibrator 100, an eaves part B not fixed to the input electrode 102b or the support electrode 102c is formed at an edge part of an anchor (supporting part) 103b at both ends of a beam 103a. Such an eaves part B greatly affects vibration of the beam 103a when the vibrator electrode 103 is further reduced.

FIG. 13 is a diagram showing a relation between length L of the beam of the micro-vibrator 100 having the above-described structure and natural frequency of vibration. As shown in this figure, a theoretical natural frequency of vibration (Theory) based on the following Equation (1) is proportional to $(1/L^2)$.

$$f_R = \frac{0.162h}{L^2}\sqrt{\frac{EK}{\rho}} \quad (1)$$

h: film thickness
E: Young's modulus
K: electromagnetic coupling factor
ρ: film density However, in the micro-vibrator 100 having the above-described structure, as is clear from a result of simulation using a finite element method, it is difficult to increase the natural frequency of vibration in proportion to $(1/L^2)$ due to effects of the eaves part B in a range (100 MHz and higher) where the beam length L is reduced to less than 10 μm and the beam 103a and the anchor 103b supporting the beam 103a are of substantially the same length.

It is accordingly an object of the present invention to provide a micromachine having a vibrator electrode capable of realizing higher natural frequency of vibration in proportion to $(1/L^2)$ even in a high frequency range of 100 MHz and higher.

SUMMARY OF THE INVENTION

In order to achieve the object, according to the present invention, there is provided a micromachine characterized by including: an input electrode and an output electrode disposed on a substrate; and a band-shaped vibrator electrode formed by laying a vibrating part over the output electrode with a space part interposed between the output electrode and the vibrator electrode in a state in which both end parts of the vibrator electrode are supported on the input electrode and the substrate; wherein an entire surface of each of the end parts of the vibrator electrode from an edge of each of the end parts to the vibrating part is completely fixed to the input electrode and the substrate.

In the thus included micromachine, since the entire surface of both end parts of the vibrator electrode from the edge of the end parts to the vibrating part is completely fixed to the base, only the vibrating part is disposed with a space part interposed between the vibrating part and the base. Therefore, when the vibrator electrode is vibrated by applying a voltage of a predetermined frequency to the vibrator electrode via the input electrode, only the vibrating part is involved in vibration, and vibrates. Thus, a natural frequency of the vibration is closer to the theoretical value (a value inversely proportional to a square of length L of the vibrating part), making it easy to achieve higher frequency by microfabrication.

The present invention also represents a method of manufacturing the thus included micromachine, which method is carried out by the following procedure.

In a first manufacturing method, an input electrode and an output electrode are formed by patterning a first conductive layer on a substrate, and then an insulative protective film is formed on an upper surface of the input electrode and on the substrate on an opposite side from the input electrode with the output electrode interposed between the input electrode and the opposite side. Next, a sacrificial layer capable of being etched selectively without affecting the protective film is formed on the substrate in a state of covering the input electrode and the output electrode with a surface of the protective film exposed. Connecting holes reaching the input electrode and the substrate are formed in the protective film. Thereafter a band-shaped vibrator electrode having both end parts completely covering insides of the connecting holes, an edge of each of the end parts being situated on the protective film, and having a central part crossing over the output electrode is formed by forming and patterning a second conductive layer on the sacrificial layer including the insides of the connecting holes. Next, a space part is created between the vibrator electrode and the output electrode by selectively removing the sacrificial layer.

According to the first manufacturing method, the pattern of the vibrator electrode is formed such that the vibrator electrode covers the insides of the connecting holes and an edge of each of the end parts of the vibrator electrode is situated on the protective film in a state of the sacrificial layer being laid on the substrate so as to expose the protective film having the connecting holes formed therein. Thus, only the central part of the vibrator electrode is disposed on the sacrificial layer in a state of the entire surface of both ends of the vibrator electrode being disposed on the connecting holes and the protective film. Then, in this state, the sacrificial layer is removed selectively without affecting the protective film. Therefore, the vibrator electrode is formed which has a shape such that the space part is provided only under the central part and such that without the edge of both end parts of the vibrator electrode being extended beyond the surface of the protective film, the entire surface of both end parts of the vibrator electrode is fixed to the protective film and the connecting holes. Since the pattern of the vibrator electrode is formed so as to cover the connecting holes, even when the input electrode disposed at a bottom part of the connecting hole is formed by the same material as the vibrator electrode, the input electrode within the connecting hole is not affected by the pattern formation of the vibrator electrode.

In a second manufacturing method, an input electrode and an output electrode are formed by patterning a first conductive layer on a substrate, and then a sacrificial layer covering the input electrode and the output electrode is formed over the substrate. Next, a connecting hole reaching the input electrode and a connecting hole reaching a surface of the substrate on an opposite side from the input electrode with the output electrode interposed between the input electrode and the opposite side are formed in the sacrificial layer, and a second conductive layer capable of being etched selectively without affecting the first conductive layer is formed on the sacrificial layer including these connecting holes. Thereafter a band-shaped vibrator electrode having an edge of both end parts disposed within each of the connecting holes, and having a central part crossing over the output electrode is formed by selective pattern etching of the second conductive layer without affecting the first conductive layer. Next, a space part is created between the vibrator electrode and the output electrode by selectively removing the sacrificial layer.

According to the second manufacturing method, the pattern of the vibrator electrode is formed on the sacrificial layer having the connecting holes reaching the input electrode and the substrate, respectively, such that the edge of both end parts is disposed within the connecting holes. Thus, only the central part of the vibrator electrode is disposed on the sacrificial layer in a state of the entire surface of both ends of the vibrator electrode being disposed within the connecting holes. Since the second conductive layer forming the vibrator electrode can be etched selectively without affecting the first conductive layer forming the input electrode, at the time of the pattern formation of the vibrator electrode, a part of the input electrode which part is exposed at a bottom part of the connecting hole is not affected by the the pattern formation of the vibrator electrode. Then, in this state, the sacrificial layer is selectively removed. Therefore, the vibrator electrode is formed which has a shape such that the space part is provided only under the central part and such that the entire surface of both end parts of the vibrator electrode is fixed to the input electrode and the substrate.

BRIEF DESCRIPTION OF DRAWINGS

FIGS. 1A to 1I are sectional process views of a manufacturing method according to a first embodiment.

DETAILED DESCRIPTION OF THE PRESENTLY PREFERRED EMBODIMENTS

Embodiments of the present invention will hereinafter be described in detail with reference to the drawings. In each of the embodiments, description will first be made of a manufacturing method, and then description will be made of a structure of a micromachine obtained by the manufacturing method.

<First Embodiment>

Figure 2:
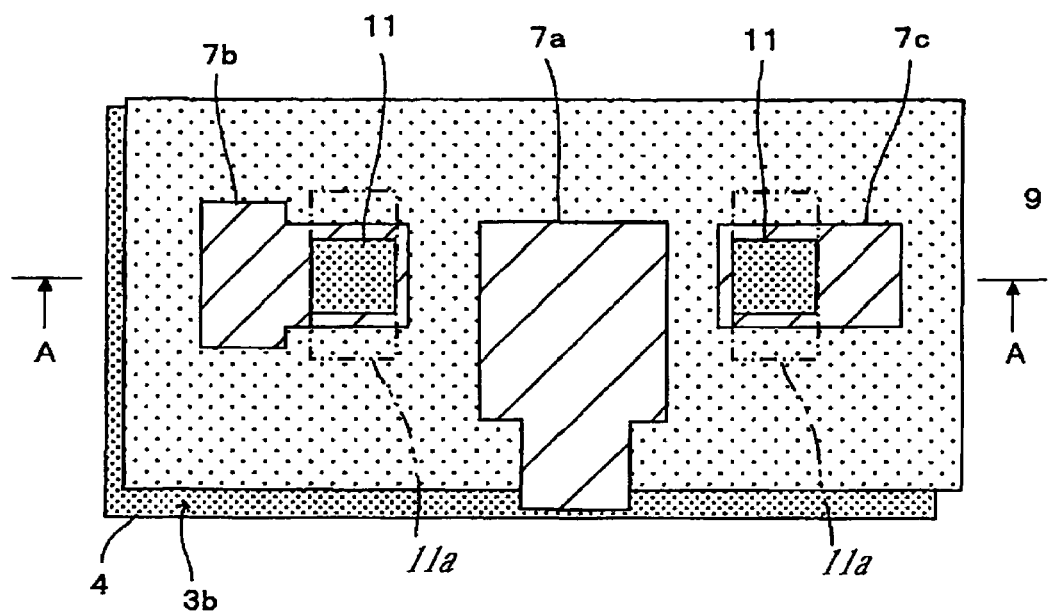
FIG. 2 is a plan view corresponding to FIG. 1D.
Figure 3:
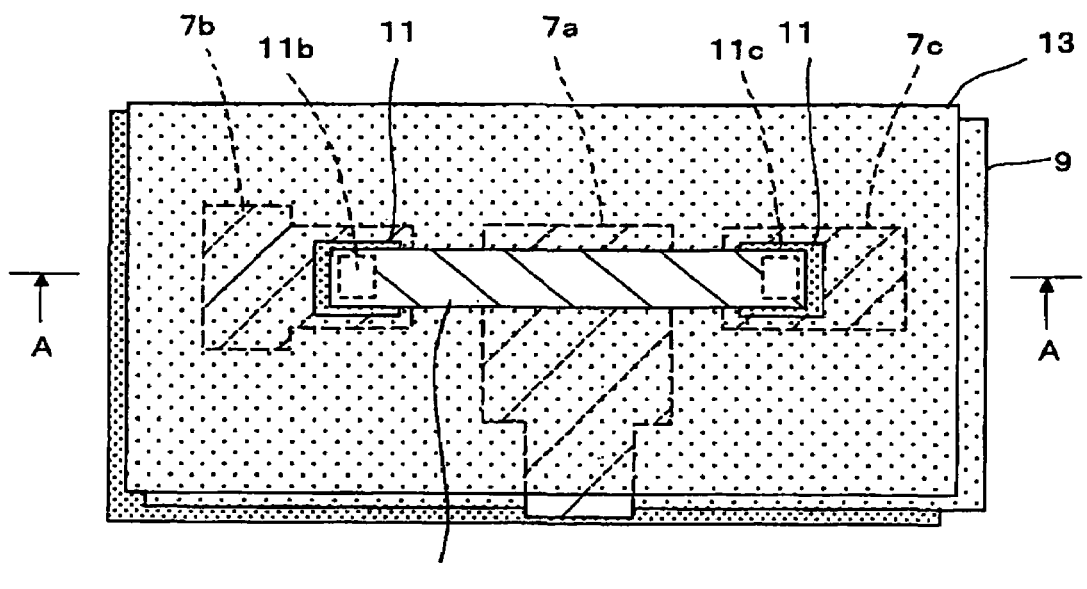
FIG. 3 is a plan view corresponding to FIG. 1G.
Figure 4:
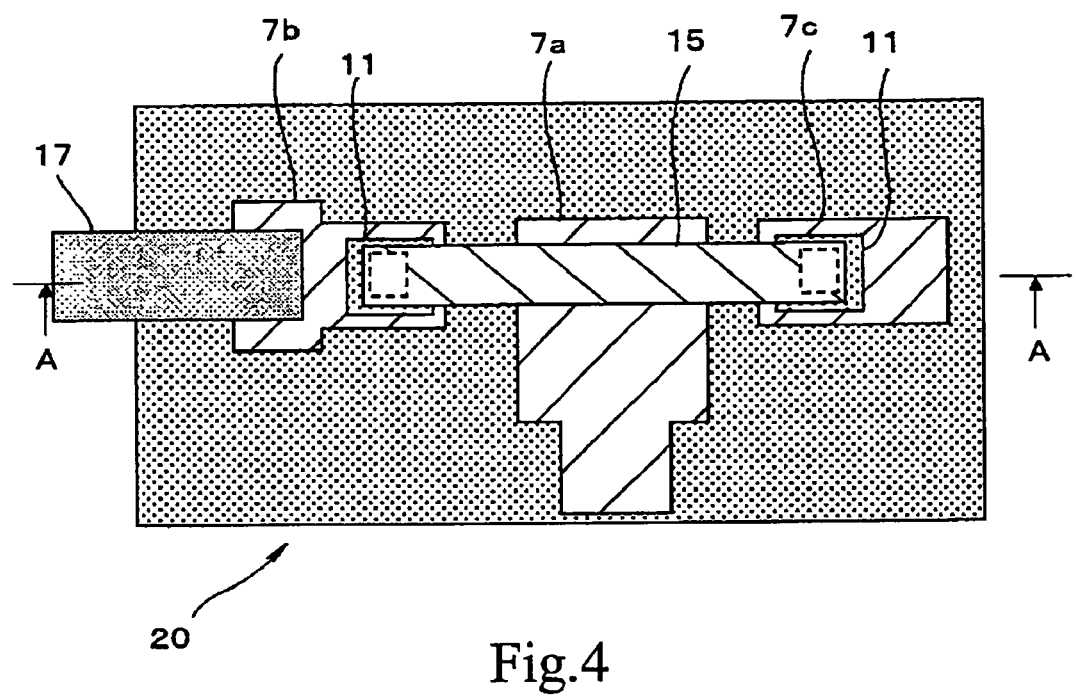
FIG. 4 is a plan view corresponding to FIG. 1I.

FIGS. 1A to 1I are sectional process views of a manufacturing method according to a first embodiment. FIGS. 2 to 4 are plan views of assistance in explaining the manufacturing method according to the first embodiment. In the following, the method of manufacturing a micromachine according to the first embodiment will be described on the basis of FIGS. 1A to 1I, referring to FIGS. 2 to 4. Incidentally, FIGS. 1A to 1I correspond to a section A-A in the plan views of FIGS. 2 to 4.

First, as shown in FIG. 1A, a substrate 4 is formed by covering a semiconductor substrate 1 such as single-crystal silicon or the like with an insulating layer 3. A top surface of the insulating layer 3 is formed by a material having an etching resistance to etching removal of a sacrificial layer (silicon oxide) which removal is to be subsequently performed. Accordingly, the insulating layer 3 is for example formed by laminating a silicon oxide film 3a for relieving stress between the insulating layer 3 and the semiconductor substrate 1 and a silicon nitride film 3b having the above-mentioned etching resistance in this order, with the silicon oxide film 3a intermediate between the silicon nitride film 3b and the semiconductor substrate 1.

Next, as shown in FIG. 1B, an output electrode 7a, an input electrode 7b, and a support electrode 7c are formed by patterning a first conductive layer on the substrate 4. The first conductive layer forming these electrodes 7a to 7c is a silicon layer such as polysilicon containing phosphorus (P), for example. The electrodes 7a to 7c are arranged on the substrate 4 such that the output electrode 7a is interposed between the input electrode 7b and the support electrode 7c.

Then, as shown in FIG. 1C, a surface of the substrate 4 exposed from the electrodes 7a to 7c is covered with a silicon oxide film 9. At this time, for example, the silicon oxide film 9 is formed on only the surface of the substrate 4 by forming the silicon oxide film on the silicon nitride film 3b so as to cover the electrodes 7a to 7c, and grinding the silicon oxide film 9 until the electrodes 7a to 7c are exposed.

Next, as shown in FIG. 1D, a protective layer 11 of an insulative material having an etching resistance to etching removal of a sacrificial layer which removal is to be subsequently performed is formed into a pattern on the substrate 4 with the input electrode 7b and the support electrode 7c interposed between the substrate 4 and the protective layer 11. At this time, when a sacrificial layer is formed by silicon oxide, for example, the protective layer 11 is formed by silicon nitride (see FIG. 2).

Incidentally, the protective layer 11 is formed by etching a silicon nitride film formed over the substrate 4 using a resist pattern (not shown) as a mask, for example. At the time of this etching, the silicon oxide film 9 protects the silicon nitride film 3b on the surface of the substrate 4. Thus, when the silicon nitride film 3b has a sufficient film thickness for the etching to form the protective layer 11, it is not necessary to form the silicon oxide film 9 in the previous process. When the silicon oxide film 9 is not formed, a protective layer 11a may be formed so as to extend from the surface of the input electrode 7b and the support electrode 7c onto the surface of the substrate 4, as shown by a dash-double-dot line in FIG. 2. Also when the surface of the substrate 4 is formed of a material having a resistance to pattern etching of a protective layer forming material, a similar protective layer 11a indicated by the dash-double-dot line may be formed.

Thereafter, as shown in FIG. 1E, a sacrificial layer 13 is laid over the insulating layer 3 in a state of only the protective layer 11 being exposed. The sacrificial layer 13 is formed of a material removed by etching selectively without affecting the surface layer (the silicon nitride film 3b in this case) of the substrate 4, the protective layer (silicon nitride in this case) 11, and the electrodes (polysilicon in this case) 7a to 7c. Such a sacrificial layer 13 is formed by making a sacrificial layer film in a state of covering the electrodes 7a to 7c, and grinding the sacrificial layer film until the protective layer 11 is exposed.

Figure 1F:
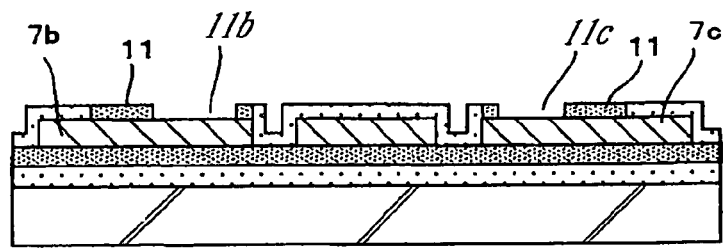

Next, as shown in FIG. 1F, a connecting hole 11b reaching the input electrode 7b and a connecting hole 11c reaching the substrate 4 via the support electrode 7c are formed in the protective layer 11.

Figure 1G:
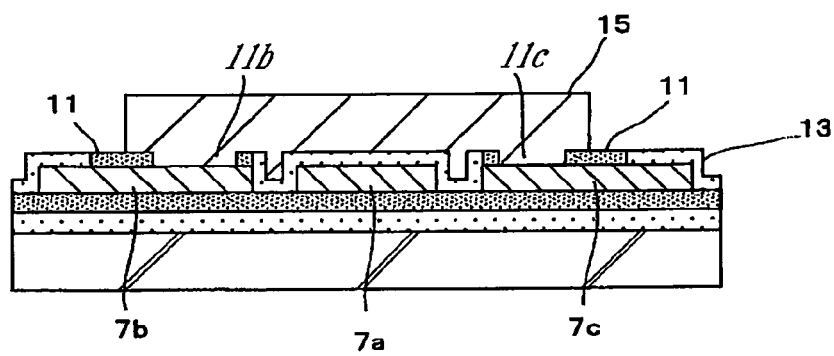

Thereafter, as shown in FIG. 1G and FIG. 3, a band-shaped vibrator electrode 15 connected to the input electrode 7b and the support electrode 7c via the connecting holes 11b and 11c and crossing over the output electrode 7a is formed. This vibrator electrode 15 is formed by pattern etching of a second conductive layer (for example a polysilicon film) formed on the sacrificial layer 13 including the inside of the connecting holes 11b and 11c. At this time, the pattern etching is performed such that both end parts of the vibrator electrode 15 completely cover the inside of the connecting holes 11b and 11c, an edge of each of the end parts is situated on the protective layer 11, and a central part of the vibrator electrode 15 crosses over the output electrode 7a.

Figure 1H:
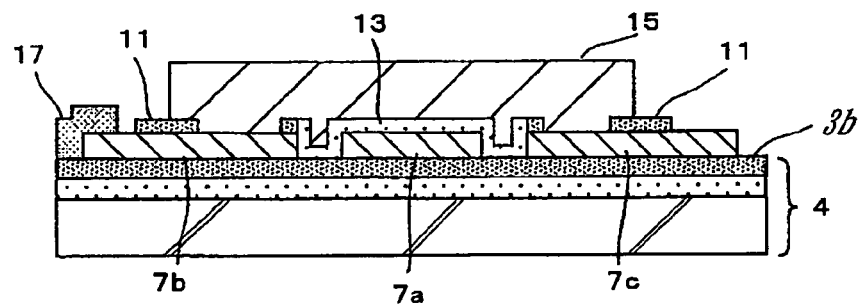

Thereafter, as shown in FIG. 1H, the sacrificial layer 13 is partially removed so as to expose a part for forming wiring connected to the input electrode 7b in a state of the sacrificial layer 13 being left under the vibrator electrode 15. In this case, a resist pattern (not shown) having such a shape as to cover at least the vibrator electrode 15 and the periphery thereof and expose the part for forming wiring connected to the input electrode 7b is formed over the substrate 4. Then, using the resist pattern as a mask, the sacrificial layer 13 (silicon oxide) 13 is selectively removed by etching without affecting the protective layer (silicon nitride) 11, the electrodes (polysilicon) 7a to 7c and 15, and the surface layer (the silicon nitride film 3a) of the substrate 4. Thereby the sacrificial layer 13 in the wiring forming part is partially removed with the sacrificial layer 13 left between the vibrator electrode 15 and the output electrode 7a. Then, the resist pattern is removed.

Next, wiring 17 is formed in a state of being connected to an exposed surface of the input electrode 7b. In forming the wiring 17, a seed layer of gold (Au) is formed over the entire surface of the substrate 4, and then a resist pattern (not shown) that exposes the wiring forming part and covers the other parts is formed. Next, the wiring 17 is formed by growing a plating layer on the seed layer within an opening of the resist pattern by a plating method. After the wiring 17 is formed, the resist pattern is removed, and the entire surface is etched to remove the seed layer.

Figure 1I:
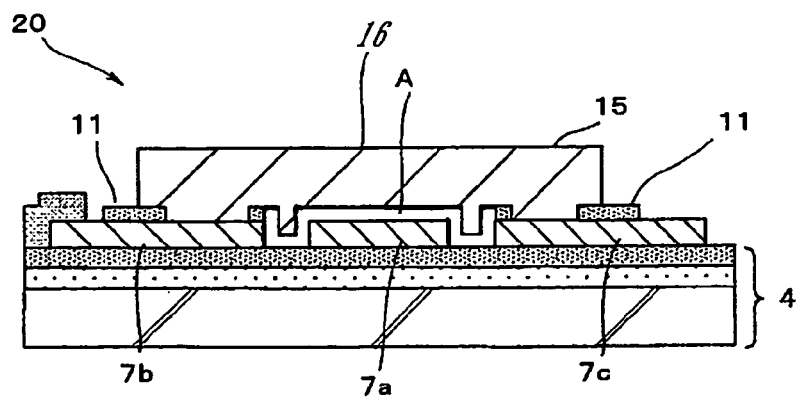

Thereafter, the sacrificial layer 13 is removed by etching selectively without affecting the protective layer 11, the electrodes 7a to 7c and 15, and the surface layer of the substrate 4. At this time, the sacrificial layer 13 formed by silicon oxide under the vibrator electrode 15 is surely removed by wet etching using buffered HF. Thereby a space part (gap) A is formed under the vibrator electrode 15 as shown in FIG. 1I.

As described above, as shown in FIG. 1I and FIG. 4, a micromachine 20 is obtained which has the band-shaped vibrator electrode 15 formed by laying a beam (vibrating part) 16 over the output electrode 7a with the space part A interposed between the output electrode 7a and the vibrator electrode 15 in a state in which both end parts of the vibrator electrode 15 are supported on the input electrode 7b and the substrate 4 with the support electrode 7c interposed between the substrate 4 and the vibrator electrode 15.

As described with reference to FIG. 1G and FIG. 3, in particular, the above-described manufacturing method according to the first embodiment forms the pattern of the vibrator electrode 15 so as to cover the connecting holes 11b and 11c and dispose the edges of both end parts of the vibrator electrode 15 on the protective layer 11 in a state of the sacrificial layer 13 being formed on the substrate 4 so as to expose the protective layer 11 having the connecting holes 11b and 11c formed therein. Thus, the vibrator electrode 15 has the central part thereof disposed on the sacrificial layer 13 in a state of the entire surface of both ends of the vibrator electrode 15 being disposed on the protective layer 11 and the connecting holes 11b and 11c.

Then, in this state, the sacrificial layer 13 is removed selectively without affecting the protective layer 11, as described with reference to FIG. 1I and FIG. 4. Therefore, the vibrator electrode 15 can be obtained which has a shape such that the space part A is provided only under the central beam (vibrating part) 16 and such that without the edge of both end parts of the vibrator electrode 15 being extended beyond the surface of the protective layer 11, the entire surface from the edge of the end parts to the beam (vibrating part) 16 is fixed to the input electrode 7 and the support electrode 7c via the protective layer 11 and the connecting holes 11b and 11c.

In the micromachine 20 having the vibrator electrode 15 of such a shape, when the vibrator electrode 15 is vibrated by applying a voltage of a predetermined frequency via the input electrode 7b, only the beam (vibrating part) 16 is involved in vibration, and vibrates. Thus, a natural frequency of the vibration is closer to the theoretical value satisfying the above-described Equation (1) (a value inversely proportional to a square of length L of the vibrating part), making it easy to achieve higher frequency by microfabrication. As a result, a high frequency filter having a high Q value and a higher frequency band can be realized.

Figure 5:
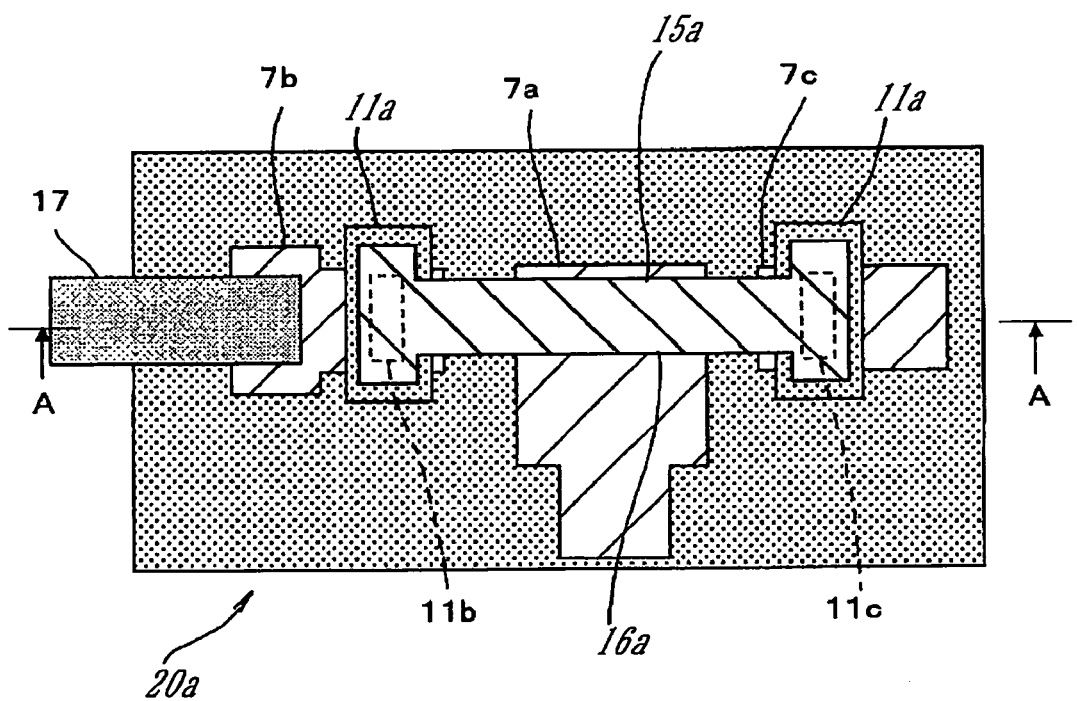
FIG. 5 is a plan view of an example of another structure of the first embodiment.

Incidentally, when the protective layer 11a is provided so as to extend from the surface of the input electrode 7b and the support electrode 7c onto the surface of the substrate 4, as described with reference to FIG. 2, the connecting holes 11b and 11c formed in the protective layer 11a may also have such a shape as to extend from the surface of the input electrode 7b and the support electrode 7c onto the surface of the substrate 4, as shown in FIG. 5. Also in this case, in forming a vibrator electrode 15a, pattern etching is performed such that both end parts of the vibrator electrode 15a completely cover the inside of the connecting holes 11b and 11c, an edge of each of the end parts is situated on the protective layer 11a, and a central part of the vibrator electrode 15a crosses over the output electrode 7a. Thereby, the edge of both end parts of the vibrator electrode 15a is not extended beyond the surface of the protective layer 11a, and the entire surface from the edge of the end parts to a beam (vibrating part) 16a is fixed to the input electrode 7 and the support electrode 7c via the protective layer 11a and the connecting holes 11b and 11c.

A micromachine 20a having the thus formed vibrator electrode 15a makes it possible to set line width of the vibrator electrode 15' independently of line width of the input electrode 7b. Incidentally, the vibrator electrode 15a in the micromachine 20a having the structure as shown in FIG. 5 may be formed with a constant line width. In addition, since the end parts can be set sufficiently wider than the beam (vibrating part) 16a, the beam (vibrating part) 16a can be supported securely, and thus high frequency vibration closer to the theoretical value can be achieved.

<Second Embodiment>

Figure 6A:
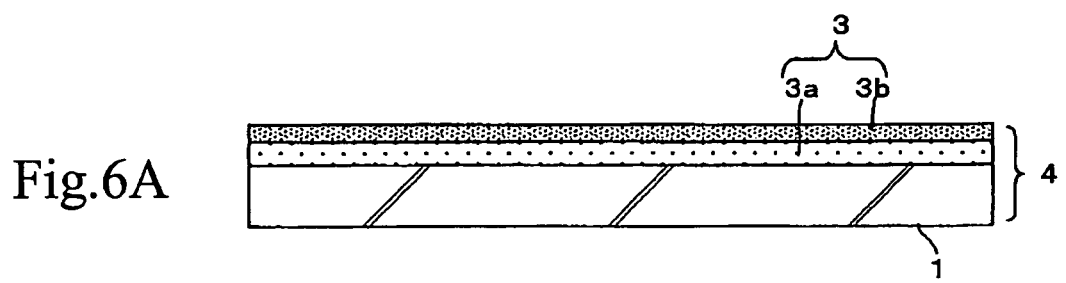
FIGS. 6A to 6G are sectional process views of a manufacturing method according to a second embodiment.
Figure 7:
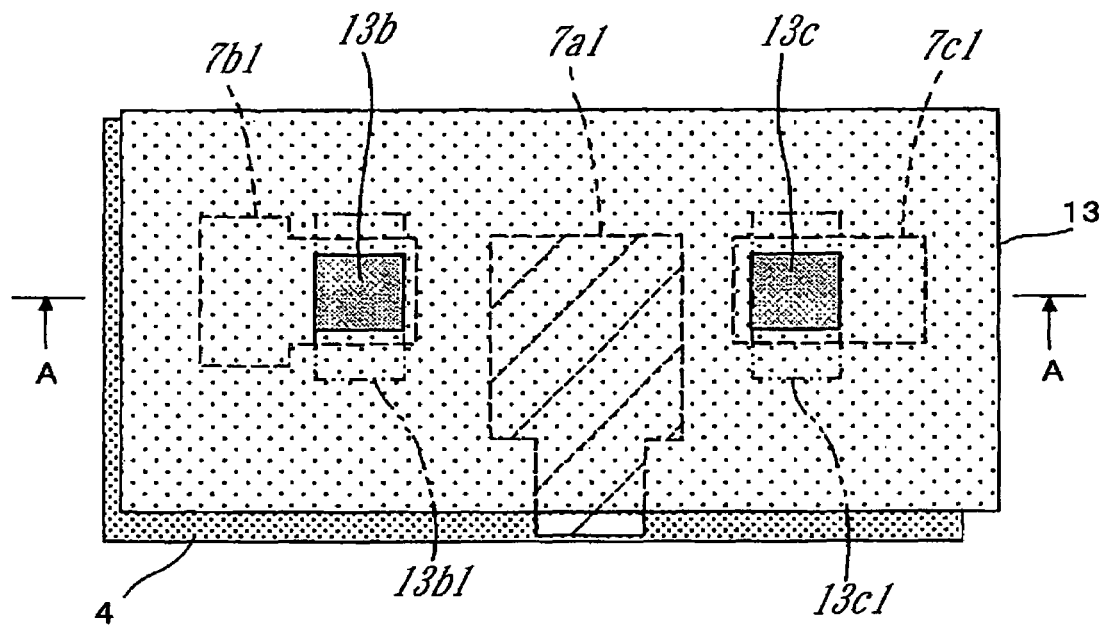
FIG. 7 is a plan view corresponding to FIG. 6D.
Figure 8:
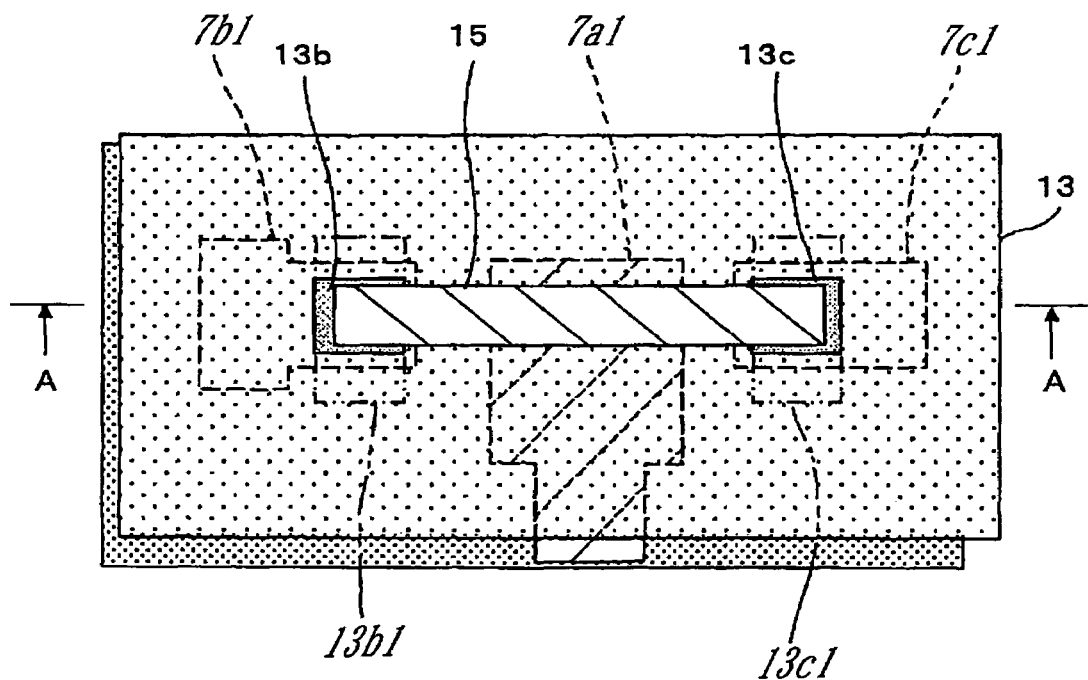
FIG. 8 is a plan view corresponding to FIG. 6E.
Figure 9:
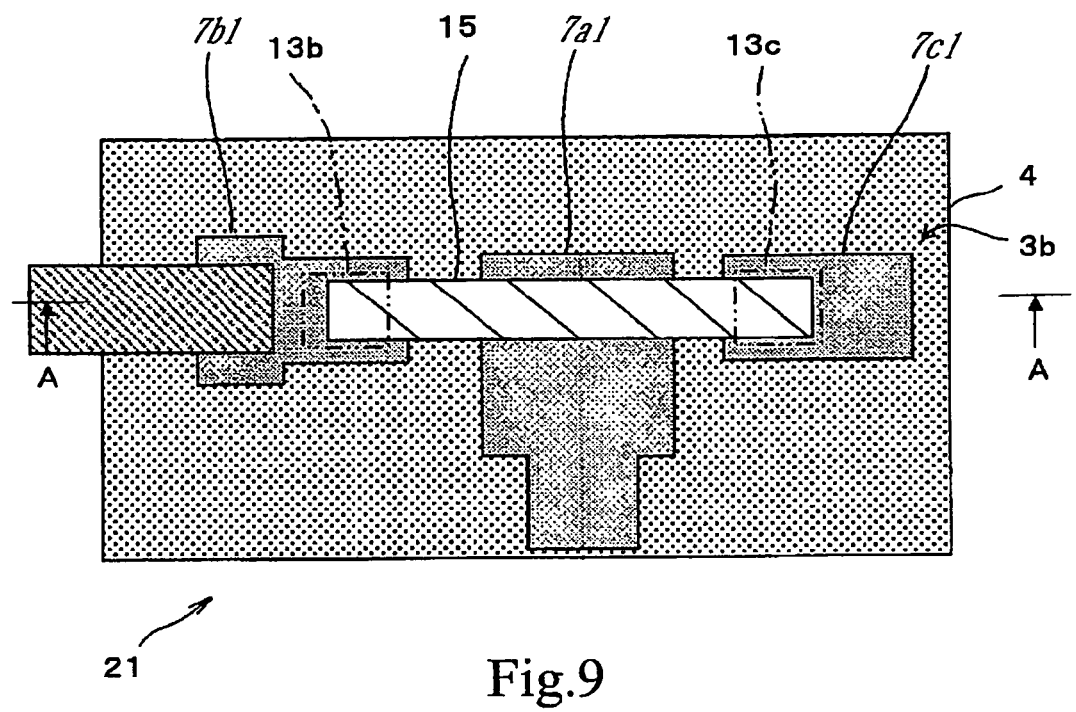
FIG. 9 is a plan view corresponding to FIG. 6G.

FIGS. 6A to 6G are sectional process views of a manufacturing method according to a second embodiment. FIGS. 7 to 9 are plan views of assistance in explaining the manufacturing method according to the second embodiment. In the following, the method of manufacturing a micromachine according to the first embodiment will be described on the basis of FIGS. 6A to 6G, referring to FIGS. 7 to 9. Incidentally, FIGS. 6A to 6G correspond to a section A-A in the plan views of FIGS. 7 to 9.

First, in FIG. 6A, a process is performed in the same manner as described with reference to FIG. 1A in the first embodiment to form a substrate 4 by covering a surface of a semiconductor substrate 1 such as single-crystal silicon or the like with an insulating layer 3 formed by laminating a silicon nitride film 3b on a silicon oxide film 3a.

Figure 6B:
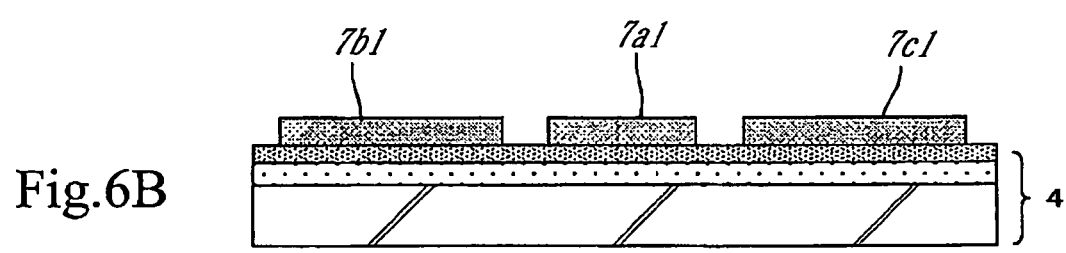

Next, as shown in FIG. 6B, an output electrode 7a1, an input electrode 7b1, and a support electrode 7c1 are formed by patterning a first conductive layer on the substrate 4. The second embodiment is characterized in that a material having an etching resistance at the time of pattern formation of a vibrator electrode to be formed subsequently is used as the first conductive layer forming the electrodes 7a1 to 7c1. Thus, when the vibrator electrode is to be formed by a silicon layer such as polysilicon, for example, the electrodes 7a1 to 7c1 are formed by using a conductive material having an etching resistance to silicon etching, for example titanium and a titanium alloy, tungsten and a tungsten alloy, polysilicon containing boron (B), diamond like carbon (DLC), or diamond containing boron (B) or nitrogen (N). Incidentally, the electrodes 7a1 to 7c1 are arranged in the same manner as the electrodes 7a to 7c of the first embodiment.

Figure 6C:
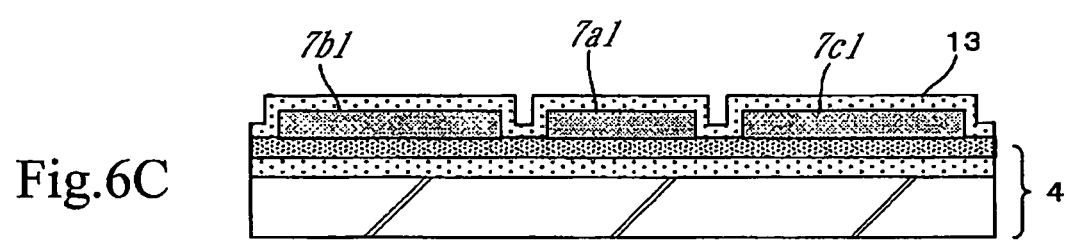

Then, as shown in FIG. 6C, a sacrificial layer 13 is laid over the substrate 4 in a state of covering the electrodes 7a1 to 7c1. The sacrificial layer 13 is formed of a material (for example silicon oxide) removed by etching selectively without affecting the surface layer (the silicon nitride film 3a in this case) of the substrate 4 and the electrodes 7a1 to 7c1.

Figure 6D:
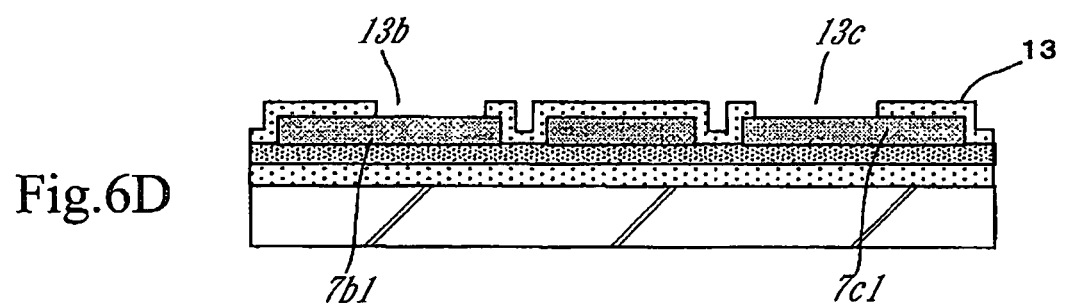

Next, as shown in FIGS. 6D and 7, a connecting hole 13b reaching the input electrode 7b1 and a connecting hole 13c reaching the surface of the substrate 4 via the support electrode 7c1 are formed in the sacrificial layer 13. These connecting holes 13b and 13c may be formed within areas of surfaces of the input electrode 7b1 and the support electrode 7c1, or may be provided as connecting holes 13b1 and 13c1 extending from the surfaces of the input electrode 7b1 and the support electrode 7c1 onto the surface of the substrate 4, as shown by a dash-double-dot line in FIG. 7.

Figure 6E:
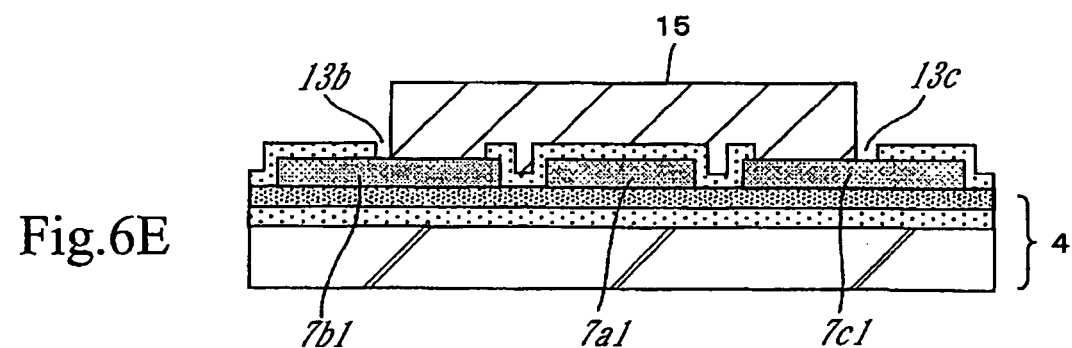

Thereafter, as shown in FIG. 6E and FIG. 8, a band-shaped vibrator electrode 15 connected to the input electrode 7b1 and the support electrode 7c1 via the connecting holes 13b and 13c and crossing over the output electrode 7a1 is formed. This vibrator electrode 15 is formed by making a second conductive layer (for example a polysilicon film) on the sacrificial layer 13 including the inside of the connecting holes 13b and 13c, the second conductive layer being able to be etched without affecting the output electrode 7a1, the input electrode 7b1, and the support electrode 7c1, and performing selective pattern etching of the second conductive layer.

The vibrator electrode 15 is formed in a pattern such that both end parts of the vibrator electrode 15 do not extend from within the connecting holes 13b and 13c. Therefore, in the case of the connecting holes 13b1 and 13c1 having a shape extending from the surface of the input electrode 7b1 and the support electrode 7c1 onto the surface of the substrate 4, both end parts of the vibrator electrode 15 may also be formed so as to extend onto the surface of the substrate 4.

Figure 6F:
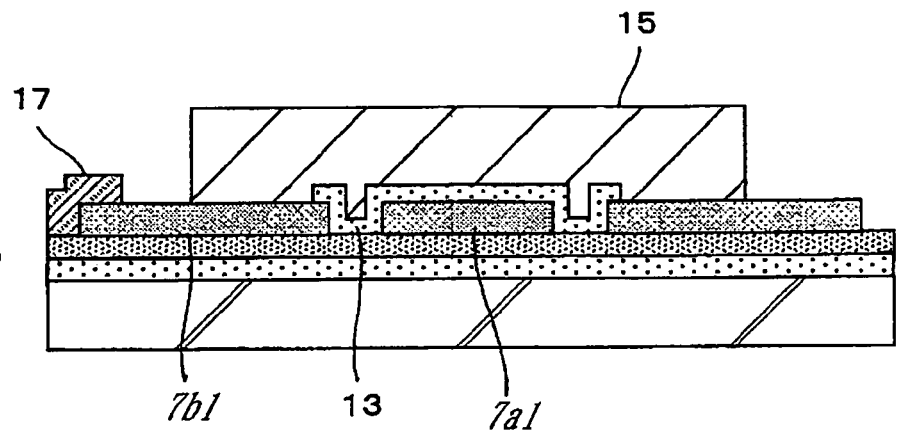

Thereafter, as shown in FIG. 6F, the sacrificial layer 13 is removed partially in a wiring forming part with the sacrificial layer 13 being left in a space under the vibrator electrode 15, and then wiring 17 connected to the input electrode 7b1 is formed. This process is performed in the same manner as described with reference to FIG. 1H in the first embodiment.

Figure 6G:
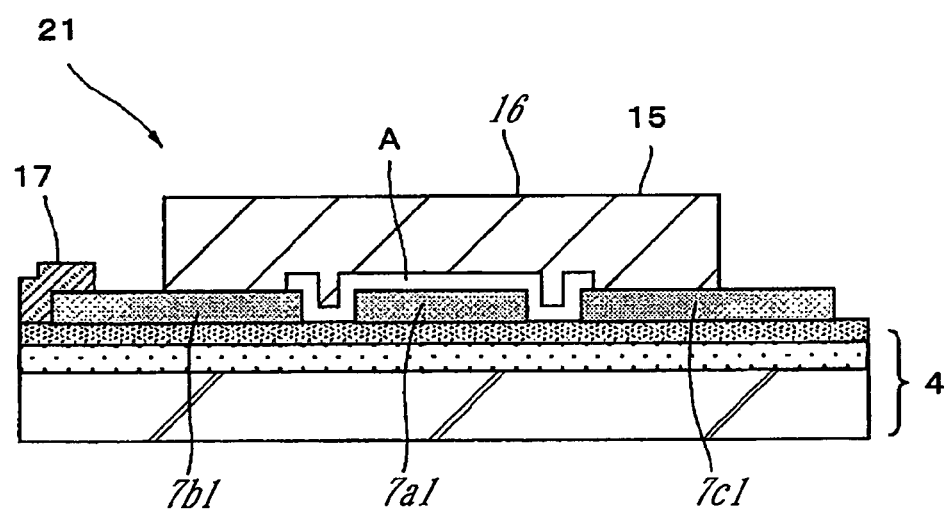

Thereafter, the sacrificial layer 13 is removed by etching selectively without affecting the electrodes 7a1 to 7c1 and 15, the surface layer of the substrate 4, and the wiring 17. Thereby, as shown in FIG. 6G and FIG. 9, a space part (gap) A is formed under the vibrator electrode 15. This process is performed in the same manner as described with reference to FIG. 1I in the first embodiment.

As described above, a micromachine 21 is obtained which has the band-shaped vibrator electrode 15 formed by laying a beam (vibrating part) 16 over the output electrode 7a1 with the space part A interposed between the output electrode 7a1 and the vibrator electrode 15 in a state in which both end parts of the vibrator electrode 15 are supported on the input electrode 7b1 and the substrate 4 with the support electrode 7c1 interposed between the substrate 4 and the vibrator electrode 15.

As described with reference to FIG. 6E and FIG. 8, in particular, the above-described manufacturing method according to the second embodiment forms the pattern of the vibrator electrode 15 such that an edge of both end parts of the vibrator electrode 15 is disposed within the connecting holes 13b and 13c provided in the sacrificial layer 13. At this time, since the second conductive layer forming the vibrator electrode 15 can be etched selectively without affecting the first conductive layer forming the input electrode 7b1 and the support electrode 7c1, the pattern of the vibrator electrode 15 can be formed without affecting the input electrode 7b1 and the support electrode 7c1 exposed at a bottom part of the connecting holes 13b and 13c at the time of forming the pattern of the vibrator electrode. As a result of the pattern formation, the vibrator electrode 15 has only a central part thereof disposed on the sacrificial layer 13 with the entire surface of both ends of the vibrator electrode 15 being disposed within the connecting holes 13b and 13c.

Then, in this state, the sacrificial layer 13 is removed selectively, as described with reference to FIG. 6G. Therefore, the vibrator electrode 15 can be obtained which has a shape such that the space part A is provided only under the central beam (vibrating part) 16 and such that the entire surface of both end parts of the vibrator electrode 15 is fixed to the input electrode 7b1 and the support electrode 7c1 on the substrate 4.

Also in the micromachine 21 having the vibrator electrode 15 of such a shape, as in the micromachines 20 and 20a according to the first embodiment, when the vibrator electrode 15 is vibrated by applying a voltage of a predetermined frequency via the input electrode 7b, only the beam (vibrating part) is involved in vibration, and vibrates. Thus, a natural frequency of the vibration is closer to the theoretical value (the value inversely proportional to the square of length L of the vibrating part), making it easy to achieve higher frequency by microfabrication. As a result, a high frequency filter having a high Q value and a higher frequency band can be realized.

Figure 10:
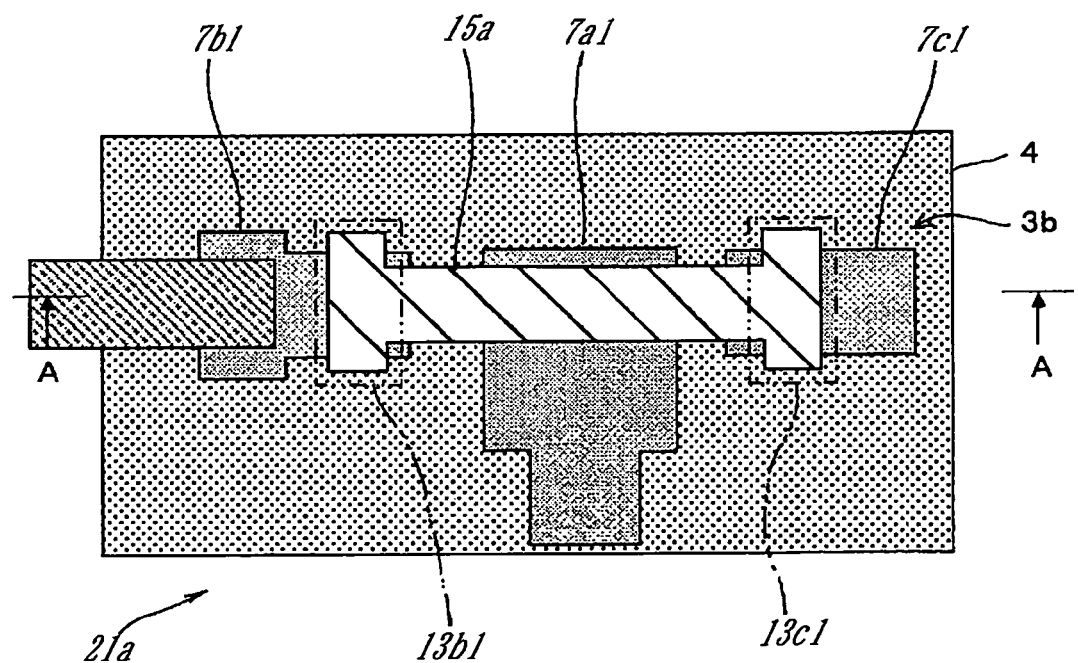
FIG. 10 is a plan view of an example of another structure of the second embodiment.
Figure 11:
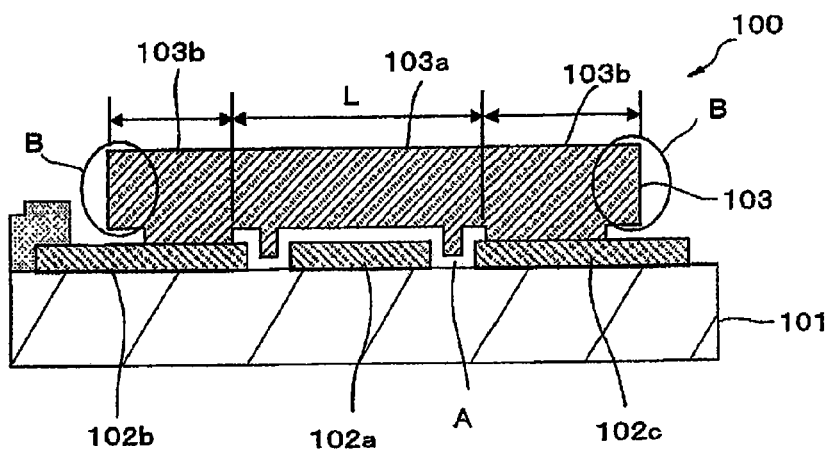
FIG. 11 is a diagram showing a structure of a conventional micromachine (micro-vibrator)
Figure 12A:
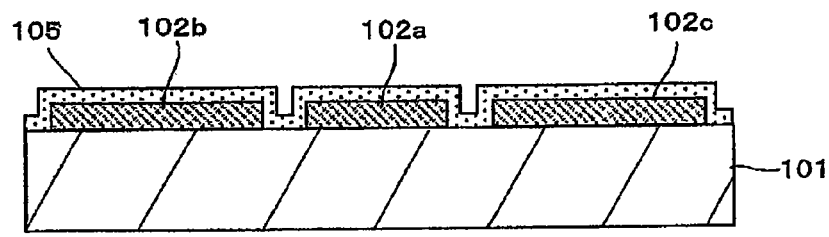
FIGS. 12A to 12C are sectional process views of a conventional manufacturing method.
Figure 12B:
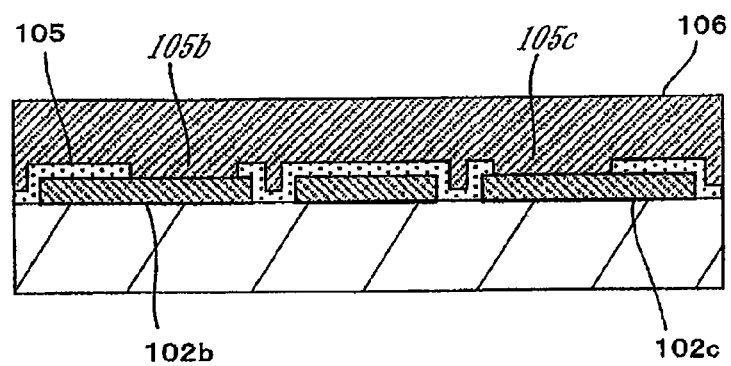
Figure 12C:
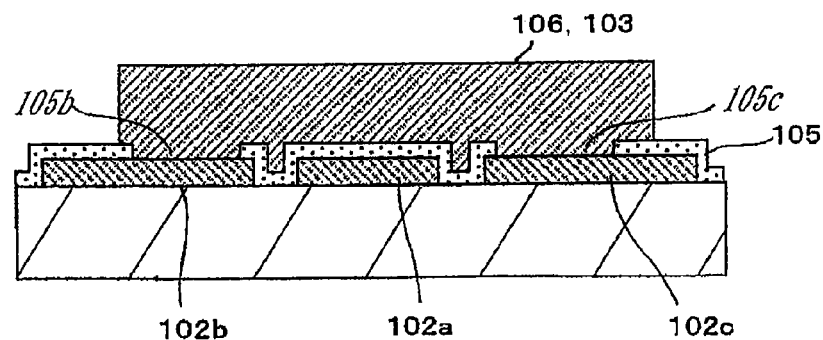
Figure 13:
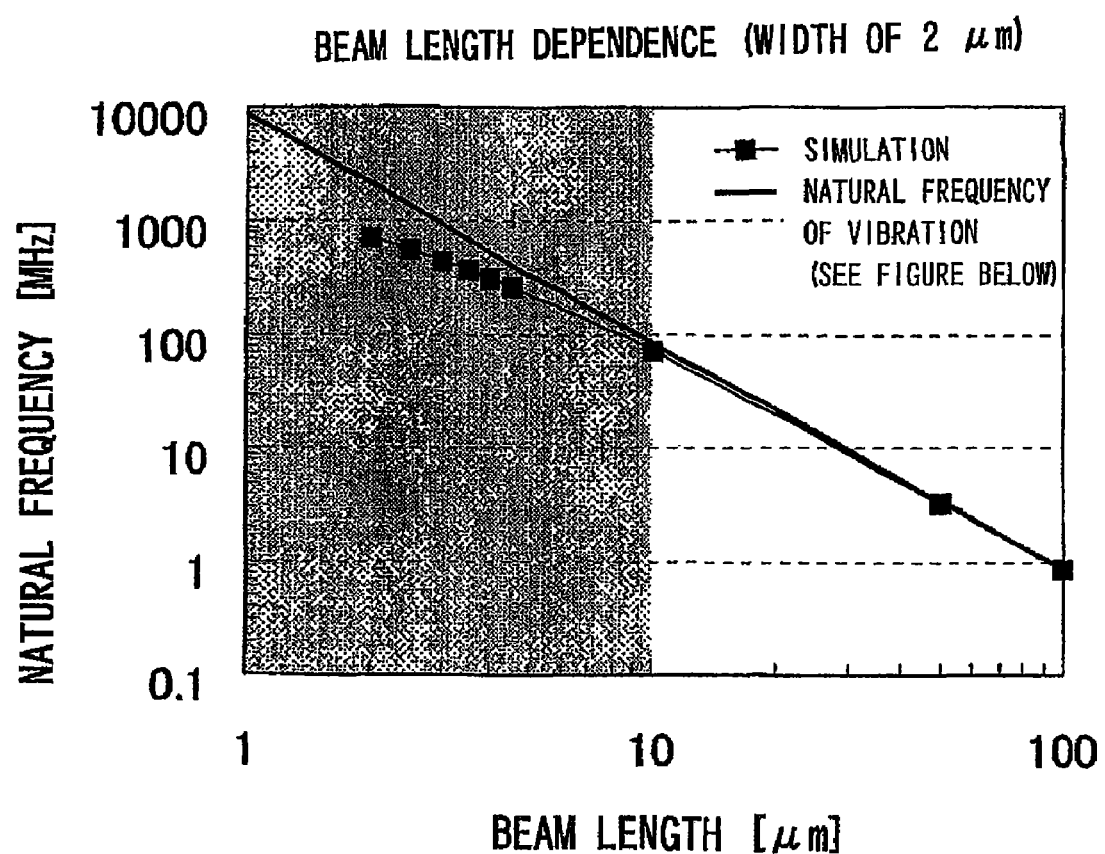
FIG. 13 is a graph of assistance in explaining a problem of the conventional micromachine.

Incidentally, when the connecting holes 13b1 and 13c1 are provided so as to extend from the surface of the input electrode 7b and the support electrode 7c onto the surface of the substrate 4 as described with reference to FIG. 7, both end parts of a vibrator electrode 15a can also be formed so as to extend onto the surface of the substrate 4, as shown in FIG. 10. It is therefore possible to set line width of the vibrator electrode 15a independently of line width of the input electrode 7b1. Such a vibrator electrode 15a may be formed with a constant line width or may be formed with only end parts having a greater line width. In addition, since the end parts can be set sufficiently wider than the beam (vibrating part) 16a, the beam (vibrating part) 16a can be securely supported. Thus a micromachine 21a that can achieve high frequency vibration closer to the theoretical value can be obtained.

When the support electrode 7c1 is not formed in the above-described second embodiment, the connecting hole 13c is formed so as to reach the substrate 4 in the process described with reference to FIG. 6D. Thereby a micromachine that can provide similar effects is obtained.

INDUSTRIAL APPLICABILITY

As described above, in accordance with a micromachine and a method for manufacturing the same according to the present invention, a vibrator electrode is formed such that a space part is provided only under a beam (vibrating part) and the entire surface of both end parts supporting the beam is fixed to an input electrode and a base such as a substrate or the like. Thus, when the vibrator electrode is vibrated by applying a voltage of a predetermined frequency via the input electrode, only the beam (vibrating part) is involved in vibration, and therefore a natural frequency of the vibration closer to the theoretical value can be obtained. It is thereby possible to facilitate achievement of higher frequency by microfabrication of the vibrator electrode, and thus realize a high frequency filter having a high Q value and a higher frequency band.

The invention claimed is:

1. A micromachine comprising:
   a substrate;
   a first electrode, a second electrode, and a support electrode disposed on said substrate;
   one or more protective films disposed on said first electrode and said support electrode; and
   a band-shaped vibrator electrode comprising (a) a vibrating part overlaying said second electrode, the vibrating part being spaced apart from the second electrode with a gap therebetween, and (b) end parts secured to said first electrode and said support electrode, a portion of each end part overlying one of the protective films.

2. A micromachine as claimed in claim 1, wherein, said vibrator electrode is formed of a material capable of being etched selectively without affecting a material of said first electrode.

3. A micromachine as claimed in claim 1, wherein, a width of the end part of said vibrator electrode which is fixed to said first electrode is greater than the width of said first electrode.

4. A micromachine as set forth in claim 1, wherein said first electrode is an input electrode and said second electrode is an output electrode.

* * * * *